(12) United States Patent
Huang et al.

(10) Patent No.: US 9,978,763 B2
(45) Date of Patent: May 22, 2018

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventors: Herb He Huang, Shanghai (CN); Clifford Ian Drowley, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days. days.

(21) Appl. No.: 15/401,286

(22) Filed: Jan. 9, 2017

(65) Prior Publication Data

US 2017/0117286 A1 Apr. 27, 2017

Related U.S. Application Data

(62) Division of application No. 14/596,782, filed on Jan. 14, 2015, now Pat. No. 9,553,097.

(30) Foreign Application Priority Data

Jan. 26, 2014 (CN) .......................... 2014 1 0038085

(51) Int. Cl.
*H01L 27/115* (2017.01)
*H01L 27/11543* (2017.01)
(Continued)

(52) U.S. Cl.
CPC .. *H01L 27/11543* (2013.01); *H01L 21/26513* (2013.01); *H01L 21/28273* (2013.01);
(Continued)

(58) Field of Classification Search
CPC ......... H01L 27/11521; H01L 29/66825; H01L 27/11524
See application file for complete search history.

(56) References Cited

U.S. PATENT DOCUMENTS 6,506,646 B1 * 1/2003 Miyagi ............. H01L 21/28273
257/E21.209
2003/0042530 A1 3/2003 Nakagawa
(Continued)

*Primary Examiner* — Ermias Woldegeorgis
(74) *Attorney, Agent, or Firm* — Innovation Counsel LLP

(57) ABSTRACT

A semiconductor device includes a substrate, a first transistor, and a second transistor. The first transistor includes a first source terminal formed of a material and connected to a first source, a first drain terminal formed of the material and connected to a first drain, a first gate overlapping a portion of the substrate that is between the first source and the first drain, and a first dielectric layer between the first gate and the substrate. The second transistor includes a control gate formed of the material and overlapping a part of the substrate that is positioned between a second source and a second drain, a second dielectric layer between the control gate and the substrate, a floating gate extending through the second dielectric layer to contact a doped region in the substrate, and an insulating member positioned between the control gate and the floating gate.

7 Claims, 7 Drawing Sheets

(51) Int. Cl.
  *H01L 27/11521*  (2017.01)
  *H01L 21/311*   (2006.01)
  *H01L 21/265*   (2006.01)
  *H01L 21/28*    (2006.01)
  *H01L 27/11524* (2017.01)
  *H01L 29/66*    (2006.01)

(52) U.S. Cl.
  CPC ... *H01L 21/31111* (2013.01); *H01L 27/11521* (2013.01); *H01L 27/11524* (2013.01); *H01L 29/66825* (2013.01)

(56) References Cited

U.S. PATENT DOCUMENTS

| | | | |
|---|---|---|---|
| 2004/0033664 A1* | 2/2004 | Park | H01L 27/105 438/264 |
| 2007/0042547 A1 | 2/2007 | Kikuchi | |
| 2007/0257298 A1 | 11/2007 | Lojek | |
| 2010/0047981 A1 | 2/2010 | Kyuutoku | |

\* cited by examiner

US 9,978,763 B2

SEMICONDUCTOR DEVICE, RELATED MANUFACTURING METHOD, AND RELATED ELECTRONIC DEVICE

CROSS-REFERENCE TO RELATED APPLICATION

This is a divisional application of U.S. application Ser. No. 14/596,782 filed on 14 Jan. 2015, which claims priority to and benefit of Chinese Patent Application No. 201410038085.2, filed on 26 Jan. 2014, the disclosures of which are incorporated herein by their reference.

BACKGROUND OF THE INVENTION

The present invention is related to a semiconductor device, a method for manufacturing the semiconductor device, and an electronic device that includes the semiconductor device.

A semiconductor device may have an electrically erasable programmable read-only memory tunnel oxide (EPROM tunnel oxide or ETOX) structure for performing functions related to data storage. Typically, a conventional ETOX structure may require a relatively high write voltage and a relatively high erase voltage. In contrast, a semiconductor floating gate ETOX may operate with relatively lower voltages and may operate at a relatively high speed.

A semiconductor device having a semiconductor floating gate ETOX structure may operate at a speed equivalent to the speed of a dynamic random-access memory (DRAM) and may advantageously have a relatively low refresh rate (and a relatively long retention time). A semiconductor device having a semiconductor floating gate ETOX structure may also advantageously have a smaller bit cell than a static random-access memory (SRAM). Therefore, semiconductor devices with semiconductor floating gate ETOX structures may have various applications. For example, in place of a SRAM in a video buffer module, a semiconductor device with a semiconductor floating gate ETOX structure may be used in a system-on-chip (SOC) driver chip of a liquid-crystal display (LCD).

Nevertheless, semiconductor devices with well-known semiconductor floating gate ETOX structures may have substantially complicated structures and/or may require substantially complicated manufacturing processes.

SUMMARY

An embodiment of the present invention may be related to a semiconductor device that may include a semiconductor substrate, a first transistor, and a second transistor.

The first transistor may include the following elements: a first source electrode positioned in the semiconductor substrate, a first drain electrode positioned in the semiconductor substrate, a first source connecting terminal formed of a first material and electrically connected to the first source electrode, a first drain connecting terminal formed of the first material and electrically connected to the first drain electrode, a first gate electrode overlapping a portion of the semiconductor substrate that is positioned between the first source electrode and the first drain electrode, and a first gate dielectric layer positioned between the first gate electrode and the semiconductor substrate.

The second transistor may include the following elements: a doped region positioned in the semiconductor substrate, a second source electrode positioned in the semiconductor substrate, a second drain electrode positioned in the semiconductor substrate, a control gate electrode formed of the first material and overlapping a part of the semiconductor substrate that is positioned between the second source electrode and the second drain electrode, a second gate dielectric layer positioned between the control gate electrode and the semiconductor substrate and contacting the control gate electrode, a floating gate electrode having a first portion extending through an opening of the second gate dielectric layer to contact the doped region and having a second portion positioned between the control gate electrode and the second gate dielectric layer, and an insulating member positioned between the control gate electrode and the floating gate electrode.

Each of the second source electrode and the second drain electrode may be N-doped. The doped region may be P-doped. The floating gate electrode may be P-doped.

The second transistor may include a drain extension positioned in the semiconductor substrate and directly contacting each of the second drain electrode and the doped region.

The first gate dielectric layer may be formed of a first dielectric material, and the second gate dielectric layer may be formed of the first dielectric material.

The first gate electrode may be formed of at least one of the first material and a second material, and the floating gate electrode may be formed of the at least one of the first material and the second material. The material of the first gate electrode may be the same as the material of the floating gate electrode.

The first gate electrode may be formed of a polycrystalline silicon material, and the floating gate electrode may be formed of the polycrystalline silicon material.

The control gate electrode may be formed of a polycrystalline silicon material, the first source connecting terminal may be formed of the polycrystalline silicon material, and the first drain connecting terminal may be formed of the polycrystalline silicon material.

Each of the first source electrode and the second source electrode may be N-doped.

The first transistor may include two offset sidewalls formed of an insulating material. The first gate electrode may be positioned between the two offset sidewalls. The insulating member may be formed of the insulating material.

The second transistor may include a first sidewall formed of an insulating material. A portion of the insulating member may be positioned between the floating gate electrode and the first sidewall. The first sidewall may be positioned between the portion of the insulating member and a portion of the control gate electrode. The first transistor may include a second sidewall formed of the insulating material. The second sidewall may be positioned between the first gate dielectric layer and one of the first source connecting terminal and the first drain connecting terminal.

The second transistor may include a first sidewall formed of an insulating material. The opening of the second gate dielectric layer may be positioned between a first portion of the second gate dielectric layer and a second portion of the second gate dielectric layer. The first portion of the second gate dielectric layer may directly contact the control gate electrode. The second portion of the second gate dielectric layer may be positioned between the first sidewall and the first portion of the floating gate electrode. The first transistor may include a second sidewall formed of the insulating material. The second sidewall may be positioned between the first gate dielectric layer and one of the first source connecting terminal and the first drain connecting terminal.

The second transistor may include a drain extension positioned in the semiconductor substrate. The opening of the second gate dielectric layer may be positioned between a first portion of the second gate dielectric layer and a second portion of the second gate dielectric layer. A portion of the drain extension may directly contact the first portion of the second gate dielectric layer and may be positioned between the second drain electrode and the doped region.

An embodiment of the present invention may be related to a method for manufacturing a semiconductor device. The method may include the following steps: preparing a semiconductor substrate; forming a first gate dielectric layer and a second dielectric layer on the semiconductor substrate; etching the second gate dielectric layer to form an opening that extends through the second gate dielectric layer; performing ion implantation through the opening to form a doped region in the semiconductor substrate; depositing a first polycrystalline silicon layer on at least one of the semiconductor substrate, the first gate dielectric layer, and the second gate dielectric layer; patterning the first polycrystalline silicon layer to form a first gate electrode on the first gate dielectric layer and to form a floating gate electrode on the second gate dielectric layer, wherein a first portion of the floating gate electrode extends through the opening to contact the doped region; depositing an insulating material layer on at least the floating electrode; patterning the insulating material layer to form an insulating member on a top surface and a side surface of the floating gate electrode; forming a first source electrode and a first drain electrode that are associated with the first gate electrode; forming a second source electrode and a second drain electrode that are associated with the floating gate electrode; depositing a second polycrystalline silicon layer on at least the insulating member; and patterning the second polycrystalline silicon layer to form a control gate electrode on the insulating member, to form a first source connecting terminal on the first source electrode, and to form a first drain connecting terminal on the first drain electrode.

The method may include the following steps: depositing a gate dielectric material layer on the semiconductor substrate; and subsequently patterning the gate dielectric material layer to form the first gate dielectric layer and the second gate dielectric layer.

P-type ions may be implanted through the ion implantation.

The method may include forming two offset sidewalls at two opposite sides of the first gate electrode using the insulating material layer when forming the insulating member.

All of the first source electrode, the first drain electrode, the second source electrode, and the second drain electrode may be formed through an N-type ion implantation process.

An electronic device may include one or more features of the aforementioned semiconductor device and/or a semiconductor device manufactured using the aforementioned method.

According to embodiments of the invention, in a semiconductor device, a plurality of components of at least two different transistors for performing different functions may be formed of a same material and may be simultaneously formed in a same process step. Advantageously, for the semiconductor device (and a related electronic device) the manufacturing process may be substantially efficient and cost-effective, the structure may be sufficiently simple, and the size may be satisfactorily small.

The above summary is related to one or more of many embodiments of the invention disclosed herein and is not intended to limit the scope of the invention.

DETAILED DESCRIPTION

Figure 1:
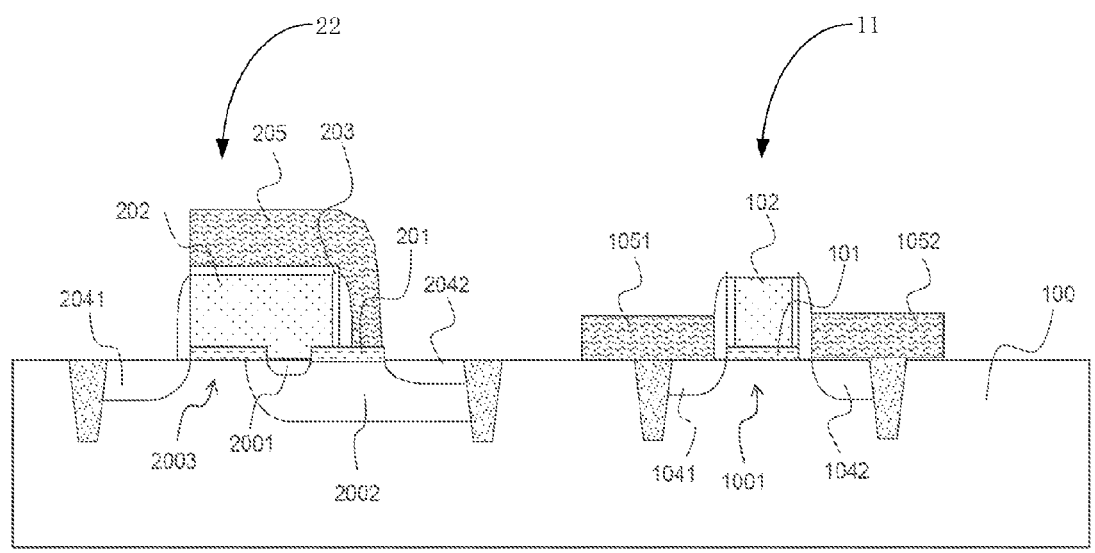
FIG. 1 shows a schematic cross-sectional view that illustrates elements and structures of a semiconductor device in accordance with an embodiment of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1 shows a schematic cross-sectional view that illustrates elements and structures of a semiconductor device in accordance with an embodiment of the present invention. As illustrated in FIG. 1, the semiconductor device may include the following elements: a semiconductor substrate 100; a first transistor 11 positioned at the semiconductor substrate 100, and a second transistor 22 positioned at the semiconductor substrate 100.

The first transistor 11 may include the following elements: a first source electrode 1041 (or first source 1041) positioned in the semiconductor substrate 100; a first drain electrode 1042 (or first source 1042) positioned in the semiconductor substrate 100; a first source connecting terminal 1051 (or first source terminal 1051) electrically connected to the first source electrode 1041; a first drain connecting terminal 1052 (or first drain terminal 1052) electrically connected to the first drain electrode 1042; a first gate electrode 102 (or first gate 102, a switch gate electrode) positioned between the first source terminal 1051 and the first drain terminal 1052 and/or overlapping a portion of the semiconductor substrate 100 that is positioned between the first source 1041 and the first drain 1042; and a first gate dielectric layer 101 positioned between the first gate 102 and the semiconductor substrate 100.

The first transistor 11 may include a first channel 1001 (e.g., a P-doped channel) positioned between the first source 1041 and the first drain 1042 and overlapping the first gate 102. The first transistor 11 may include one or more other elements, such as one or more of a gate sidewall, a gate offset sidewall, etc.

The second transistor 22 may have a semiconductor floating gate ETOX structure that may be substantially different from well-known semiconductor floating gate ETOX structures and may enable optimization of read and write rates in data storage applications.

The second transistor 22 may include the following elements: a second source electrode 2041 (or second source 2041) positioned in the semiconductor substrate 100; a second drain electrode 2042 (or second source 2042) positioned in the semiconductor substrate 100; a control gate electrode 205 (or control gate 205) overlapping a portion of the semiconductor substrate 100 that is positioned between the second source 2041 and the second drain 2042; a second gate dielectric layer 201 positioned between the control gate 205 and the semiconductor substrate 100, wherein an opening of the second gate dielectric layer 201 is positioned between a first portion of the second gate dielectric layer 201 and a second portion of the second gate dielectric layer 201, and wherein the first portion of the second gate dielectric layer 201 directly contacts the control gate 205; a floating gate electrode 202 (or floating gate 202) positioned between the control gate 205 and the semiconductor substrate 100, wherein a first portion of the floating gate 202 is positioned inside (and extends through) the opening of the second gate dielectric layer 201, wherein the second portion of the second gate dielectric layer 201 is positioned between the floating gate 202 and the semiconductor substrate 100, and wherein a second portion of the floating gate 202 is positioned between the control gate 205 and (the second portion of) the second gate dielectric layer 201; an insulating member 203 positioned between (and insulating) the control gate 205 and the floating gate 202; and a (local) doped region 2001 positioned in the semiconductor substrate 100 and directly contacting the first portion of the floating gate 202.

The floating gate 202 may be formed of a semiconductor material. In an embodiment, the floating gate 202 may be P-doped, the doped region 2001 may be P-doped, and each of the second source 2041 and the second drain 2042 may be N-doped.

The second transistor may include a drain electrode extension region 2002 (or drain extension 2002) positioned in the semiconductor substrate 100 and directly contacting each of the second drain 2042 and the doped region 2001. The doped region 2001 may be positioned between a first portion of the drain extension 2002 and a second portion of the drain extension 2002. The first portion of the drain extension 2002 may be positioned between the second drain 2042 and the doped region 2001 and may directly contact the first portion of the second gate dielectric layer 201. The second transistor 22 may include a second channel 2003 (e.g., a P-doped channel) positioned between the second source 2041 and the second drain 2042, overlapping the floating gate 202 and the control gate 205, and directly contacting the second portion of the second gate dielectric layer 201. The second portion of the drain extension 2002 may be positioned between the doped region 2001 and the second channel 2003 and may directly contact the second portion of the second gate dielectric layer 201. The drain extension 2002 may function as an extension of the second drain 2042 and may facilitate optimization of the conduction rate of the second channel 2003.

The second transistor 22 may include one or more other elements, such as one or more of a gate sidewall, a gate offset sidewall, etc.

The first gate 102 and the float gate 202 may be formed of polycrystalline silicon. The control gate may also be formed of polycrystalline silicon and/or may be formed of one or more other suitable materials.

The semiconductor device may include one or more other elements, such as one or more of a shallow trench isolation element, a well, etc.

The first gate dielectric layer 101 and the second gate dielectric layer 201 may be formed of a same material and may be (substantially simultaneously) formed in a same process step. The first gate 102 and the float gate 202 may be formed of a same material and may be (substantially simultaneously) formed in a same process step. The first source terminal 1051, the first drain terminal, and the control gate 205 may be formed of a same material and may be (substantially simultaneously) formed in a same process step. The first transistor 11 may include two offset sidewalls respectively positioned at two opposite sides of the first gate 102 (and/or two opposite sides of the first gate dielectric layer 101). The offset sidewalls and the insulating member 203 may be formed of a same material and may be (substantially simultaneously) formed in a same process step.

According to embodiments of the invention, in a semiconductor device, a plurality of components of at least two different transistors for performing different functions may be formed of a same material (i.e., identical or common material) and may be simultaneously formed in a same process step. Advantageously, for the semiconductor device (and a related electronic device) the manufacturing process may be substantially efficient and cost-effective, the structure may be sufficiently simple, and the size may be satisfactorily small.

FIG. 2A, FIG. 2B, FIG. 2C, FIG. 2D, and FIG. 2E, show schematic cross-sectional views that illustrate structures formed in a method for manufacturing the semiconductor device in accordance with an embodiment of the present invention. FIG. 3 shows a flowchart that illustrates a method for manufacturing a semiconductor device, for example, the semiconductor device related to FIGS. 2A to 2E, in accordance with an embodiment of the present invention.

Referring to FIG. 3, the method may include a step S101, a step S102, a step S103, a step S104, a step S105, and a step S106.

Figure 2A:
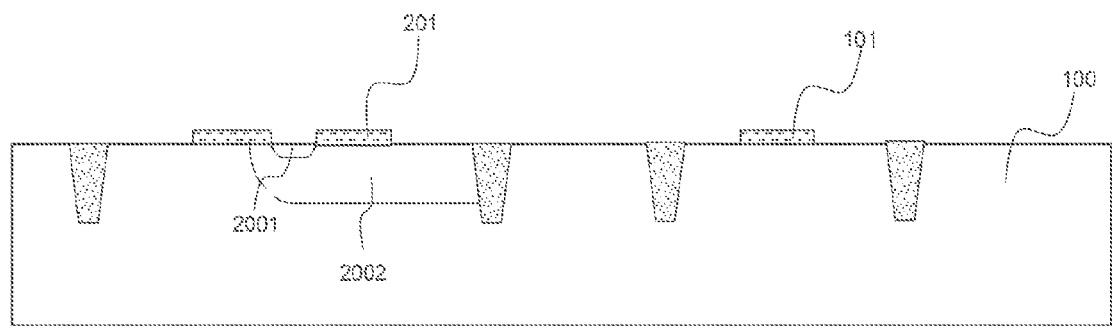
FIG. 2A, FIG. 2B, FIG. 2C, FIG. 2D, and FIG. 2E show schematic cross-sectional views that illustrate structures formed in a method for manufacturing a semiconductor device in accordance with an embodiment of the present invention.
Figure 3:
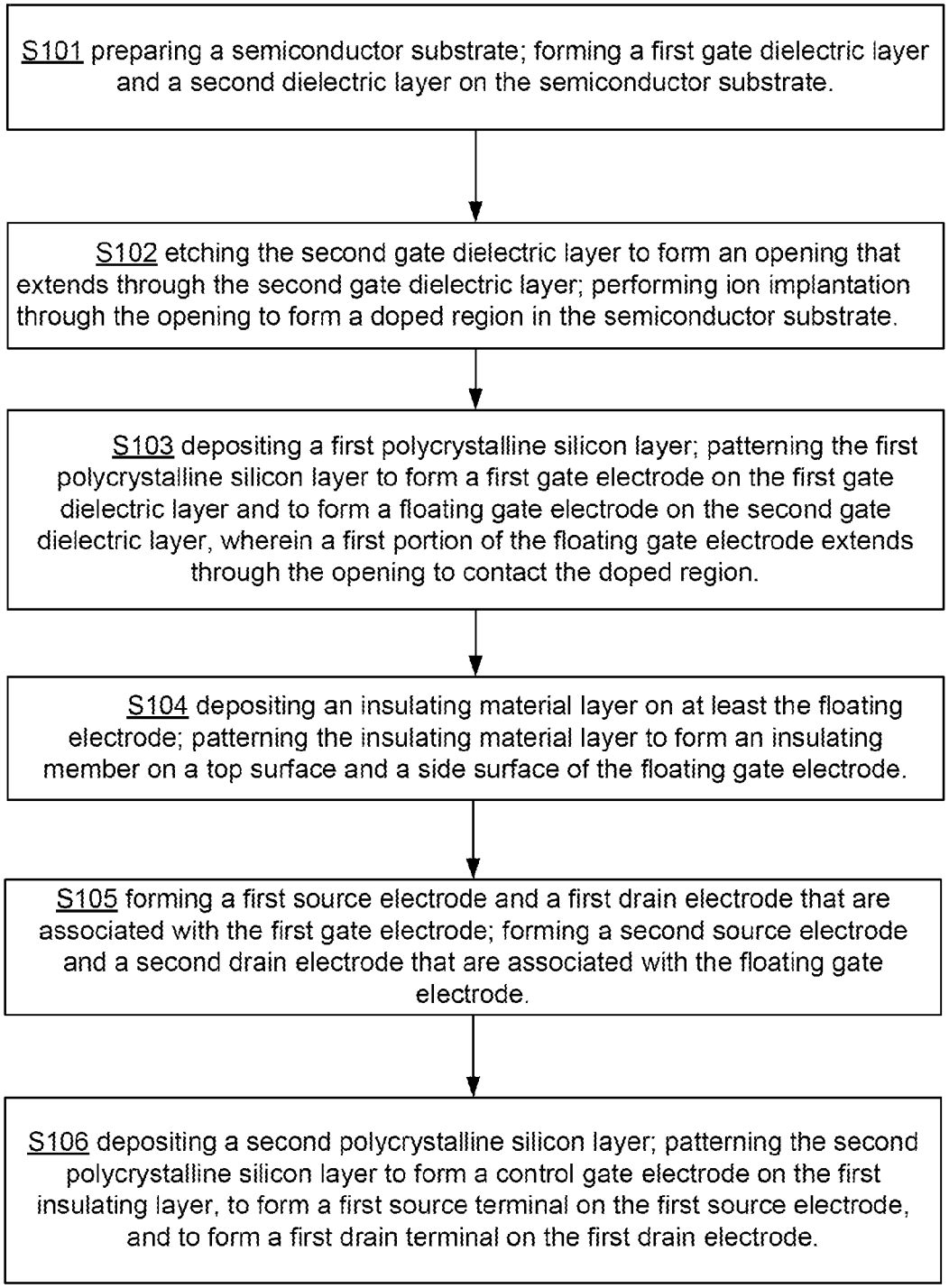
FIG. 3 shows a flowchart that illustrates a method for manufacturing a semiconductor device in accordance with an embodiment of the present invention.

Referring to FIG. 3 and FIG. 2A, the step S101 may include the following sub-steps: preparing a semiconductor substrate 100; and forming a first gate dielectric layer 101 and a second dielectric layer 201 on the semiconductor substrate 100.

The semiconductor substrate 100 may include a drain extension 2002, which may be an N-doped region. The semiconductor substrate 100 may include one or more other elements, such as one or more of a shallow trench isolation element, a well, etc.

The first gate dielectric layer 101 and the second gate dielectric layer 201 may be substantially simultaneously formed through depositing a gate dielectric material layer on the semiconductor substrate 100 and subsequently patterning the gate dielectric material layer. The second dielectric layer 201 may be formed on the drain extension 2002.

Referring to FIG. 3 and FIG. 2A, the step S102 may include the following sub-steps: etching the second gate dielectric layer 201 to form an opening that extends through the second gate dielectric layer 201; and performing ion implantation through the opening to form a (local) doped region 2001 in the semiconductor substrate 100. The implanted ions may be P-type ions, and the doped region 2001 may be a P-type doped region.

Figure 2B:
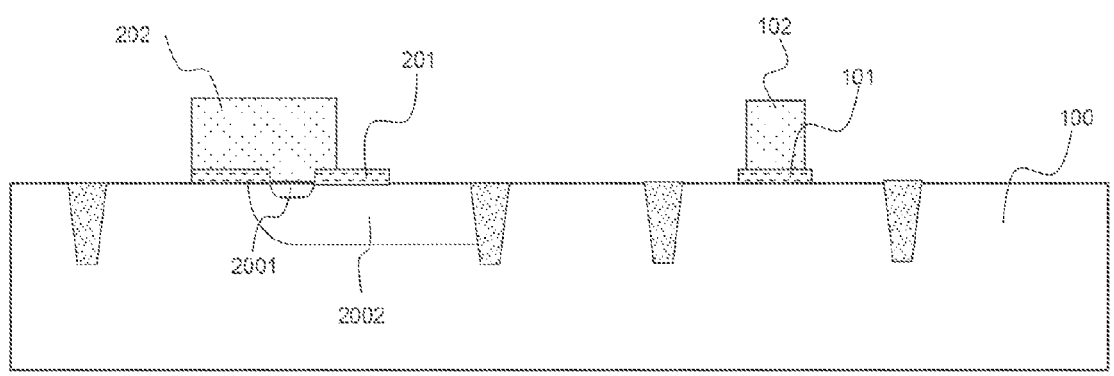

Referring to FIG. 3 and FIG. 2B, the step S103 may include the following sub-steps: depositing a first polycrystalline silicon layer that overlaps at least one of the semiconductor substrate 100, the first gate dielectric layer 101, and the second gate dielectric layer 201; and patterning the first polycrystalline silicon layer to substantially simultaneously form a first gate 102 on the first gate dielectric layer 101 and form a floating gate 202 on the second gate dielectric layer 201. A first portion of the floating gate 202 may extend through the opening of the second gate dielectric layer 201 to directly contact the doped region 2001. A first portion of the second gate dielectric layer 201 may not be covered by the floating gate 202.

Figure 2C:
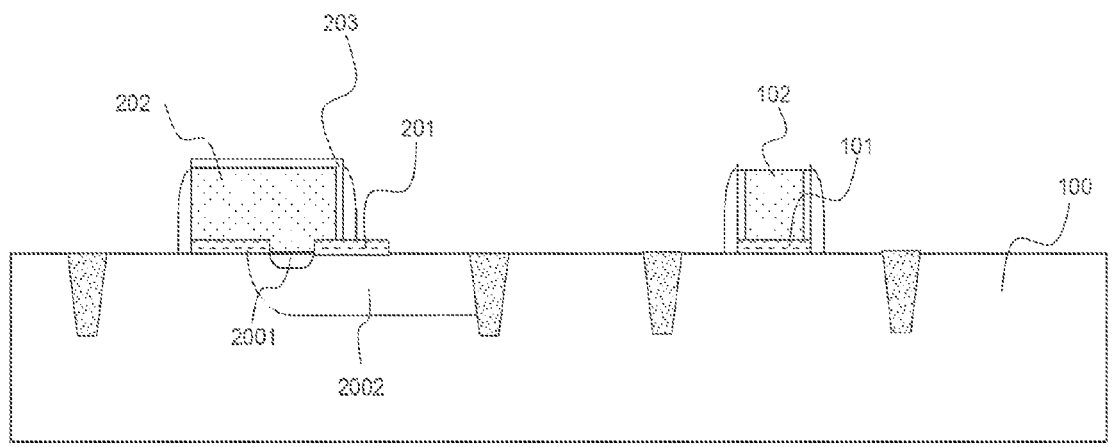

Referring to FIG. 3 and FIG. 2C, the step S104 may include the following sub-steps: depositing an insulating material layer that may cover the first gate 102 and the floating gate 202; and patterning the insulating material layer to form an insulating member 203 that may cover the top surface (opposite the second gate dielectric layer 201) and at least one side surface of the floating gate 202.

The step S104 may also include forming two offset sidewalls on two opposite side surfaces of the first gate 102 using the same insulating material layer when forming the insulating member 203. The first gate dielectric layer 101 may be positioned between the semiconductor substrate 100 and at least one of the two offset sidewalls.

The step S104 may further include forming two sidewalls at two opposite sides of each of the first gate 102 and the floating gate 202 after forming the insulating member 203 (and the two offset sidewalls). The first gate dielectric layer 101 may be positioned between the two sidewalls that are positioned at the two opposite sides of the first gate 102. The first portion of the second gate dielectric layer 201 may be positioned between the semiconductor substrate 100 and a first sidewall that is positioned at a first side of the floating gate 202. A second portion of the second gate dielectric layer 201 may be positioned between the first portion of the floating gate 202 and a second sidewall that is positioned at a second side of the floating gate 202.

Figure 2D:
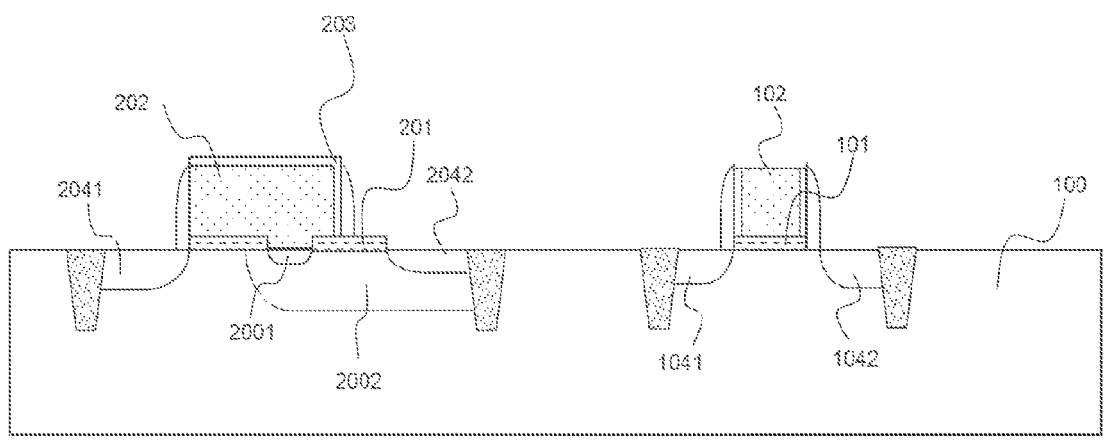

Referring to FIG. 3 and FIG. 2D, the step S105 may include the following sub-steps: forming a first source 1041 and a first drain 1042 at/near the two opposite sides of the first gate 102 and in the semiconductor substrate 100; forming a second source 2041 and a second drain 2042 at/near the two opposite sides of the floating gate 202 and in the semiconductor substrate 100. The first source 1041, the first drain 1042, the second source 2041, and the second drain 2042 may be formed through ion implantation and/or one or more other suitable processes. All of the first source 1041, the first drain 1042, the second source 2041, and the second drain 2042 may be N-doped and may be formed substantially simultaneously.

Figure 2E:
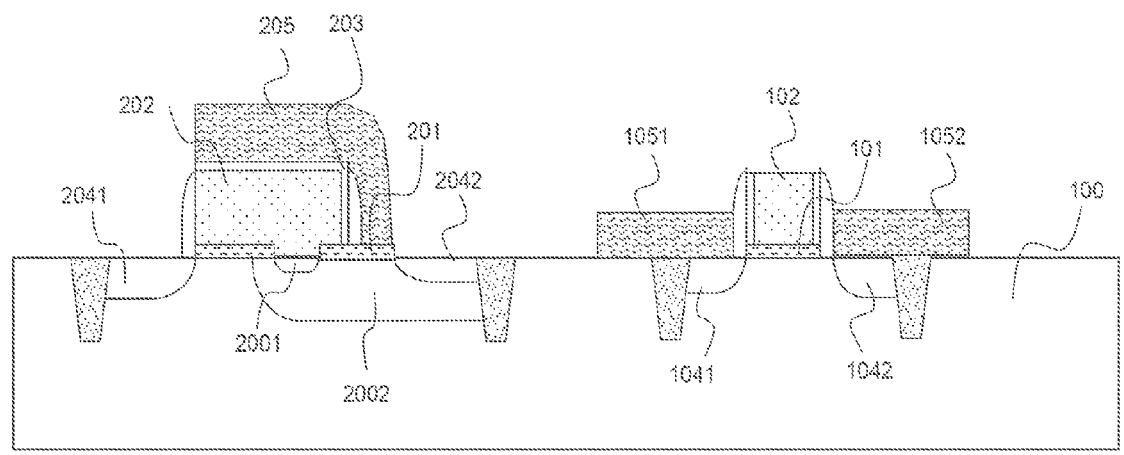

Referring to FIG. 3 and FIG. 2E, the step S106 may include the following sub-steps: depositing a second polycrystalline silicon layer on the structure illustrated in FIG. 2D; patterning the second polycrystalline silicon layer to form a control gate 205 on the insulating member 203 and the first sidewall, to form a first source terminal 1051 on the first source 1041, and to form a first drain terminal 1052 on the first drain 1042.

The control gate 205, the first source terminal 1051, and the first drain terminal 1052 may be substantially simultaneously formed in the same process step using the same material. In contrast with well-known techniques that form source terminals and drain terminals in separate process steps, embodiments of the invention may be relatively simpler, more efficient, and/or more cost-effective and may advantageously enable a smaller semiconductor device size.

An embodiment of the invention may be related to an electronic device including a semiconductor device that may include elements and/or structures analogous to or identical to elements and/or structures discussed above with reference to one or more of FIG. 1, FIG. 2A, FIG. 2B, FIG. 2C, FIG. 2D, and FIG. 2E.

In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, and a portable game device.

In an embodiment, the electronic device may be or may include an intermediate product (e.g., a mobile phone main board) or module including a semiconductor device that may have one or more of the features and advantages discussed above.

The electronic device may have advantages related to one or more of manufacturability, productivity, functionality, cost, size, etc.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:
   preparing a semiconductor substrate;
   forming a first gate dielectric layer and a second dielectric layer on the semiconductor substrate;
   etching the second gate dielectric layer to form an opening that extends through the second gate dielectric layer;
   performing ion implantation through the opening to form a doped region in the semiconductor substrate;
   depositing a first polycrystalline silicon layer on at least one of the semiconductor substrate, the first gate dielectric layer, and the second gate dielectric layer;
   patterning the first polycrystalline silicon layer to form a first gate electrode on the first gate dielectric layer and to form a floating gate electrode on the second gate dielectric layer, wherein a first portion of the floating gate electrode extends through the opening to contact the doped region;
   depositing an insulating material layer on at least the floating electrode;
   patterning the insulating material layer to form an insulating member on a top surface and a side surface of the floating gate electrode;
   forming a first source electrode and a first drain electrode that are associated with the first gate electrode;
   forming a second source electrode and a second drain electrode that are associated with the floating gate electrode;
   depositing a second polycrystalline silicon layer on at least the insulating member; and
   patterning the second polycrystalline silicon layer to form each of a control gate electrode on the insulating member, a first source connecting terminal on the first source electrode, and a first drain connecting terminal on the first drain electrode.

2. The method of claim 1, comprising: depositing a gate dielectric material layer on the semiconductor substrate; and subsequently patterning the gate dielectric material layer to form the first gate dielectric layer and the second gate dielectric layer.

3. The method of claim 1, wherein P-type ions are implanted through the ion implantation.

4. The method of claim 1, further comprising forming two offset sidewalls at two opposite sides of the first gate electrode using the insulating material layer when forming the insulating member.

5. The method of claim 1, wherein all of the first source electrode, the first drain electrode, the second source electrode, and the second drain electrode are formed through an N-type ion implantation process.

6. A method for manufacturing a semiconductor device, the method comprising:
   preparing a semiconductor substrate;
   forming a first gate dielectric layer and a second dielectric layer on the semiconductor substrate;
   etching the second gate dielectric layer to form an opening that extends through the second gate dielectric layer;
   performing ion implantation through the opening to form a doped region in the semiconductor substrate;
   depositing a first polycrystalline silicon layer on at least one of the semiconductor substrate, the first gate dielectric layer, and the second gate dielectric layer;
   patterning the first polycrystalline silicon layer to form a first gate electrode on the first gate dielectric layer and to form a floating gate electrode on the second gate dielectric layer, wherein a first portion of the floating gate electrode extends through the opening to contact the doped region;

depositing an insulating material layer on at least the floating electrode;

patterning the insulating material layer to form an insulating member on a top surface and a side surface of the floating gate electrode;

forming a first source electrode and a first drain electrode that are associated with the first gate electrode;

forming a second source electrode and a second drain electrode that are associated with the floating gate electrode;

depositing a second polycrystalline silicon layer on at least the insulating member;

patterning the second polycrystalline silicon layer to form a control gate electrode on the insulating member, to form a first source connecting terminal on the first source electrode, and to form a first drain connecting terminal on the first drain electrode; and forming two offset sidewalls at two opposite sides of the first gate electrode using the insulating material layer when forming the insulating member.

7. A method for manufacturing a semiconductor device, the method comprising:

preparing a semiconductor substrate;

forming a first gate dielectric layer and a second dielectric layer on the semiconductor substrate;

etching the second gate dielectric layer to form an opening that extends through the second gate dielectric layer;

performing ion implantation through the opening to form a doped region in the semiconductor substrate;

depositing a first polycrystalline silicon layer on at least one of the semiconductor substrate, the first gate dielectric layer, and the second gate dielectric layer;

patterning the first polycrystalline silicon layer to form a first gate electrode on the first gate dielectric layer and to form a floating gate electrode on the second gate dielectric layer, wherein a first portion of the floating gate electrode extends through the opening to directly contact the doped region;

depositing an insulating material layer on at least the floating electrode;

patterning the insulating material layer to form an insulating member on a top surface and a side surface of the floating gate electrode;

forming a first source electrode and a first drain electrode that are associated with the first gate electrode;

forming a second source electrode and a second drain electrode that are associated with the floating gate electrode;

depositing a second polycrystalline silicon layer on at least the insulating member; and patterning the second polycrystalline silicon layer to form a control gate electrode on the insulating member, to form a first source connecting terminal on the first source electrode, and to form a first drain connecting terminal on the first drain electrode.

* * * * *